United States Patent [19]

Chiang

[11] Patent Number: 5,362,999
[45] Date of Patent: Nov. 8, 1994

[54] EPLD CHIP WITH HYBRID ARCHITECTURE OPTIMIZED FOR BOTH SPEED AND FLEXIBILITY

[75] Inventor: David Chiang, Saratoga, Calif.

[73] Assignee: Xilinx, Inc., San Jose, Calif.

[21] Appl. No.: 32,920

[22] Filed: Mar. 18, 1993

[51] Int. Cl.$^5$ .......................................... H03K 19/177
[52] U.S. Cl. ........................................ 326/44; 326/21; 326/83; 326/62
[58] Field of Search ................ 307/443, 465, 465.1, 307/475, 243

[56] References Cited

U.S. PATENT DOCUMENTS

| | | | |
|---|---|---|---|
| 4,870,302 | 9/1989 | Freeman | 307/465.1 X |
| 5,023,484 | 6/1991 | Pathak et al. | 307/485 |
| 5,095,523 | 3/1992 | Delaruelle et al. | 307/465 X |
| 5,155,389 | 10/1992 | Furtek | 307/465 |

*Primary Examiner*—David R. Hudspeth
*Attorney, Agent, or Firm*—Norman R. Klivans; Edel M. Young

[57] ABSTRACT

A hybrid EPLD (chip) architecture has multiple first blocks each including a first type programmable AND array and multiple first type macrocells which are complex in structure and highly configurable; and multiple blocks each including a second type programmable AND array having fewer input lines and product term output lines than does the first type AND array, and multiple second type macrocells which have fewer logic gates than do the first type macrocells. The EPLD has a programmable interconnect matrix for interconnecting all the blocks.

14 Claims, 5 Drawing Sheets

EPLD CHIP WITH HYBRID ARCHITECTURE OPTIMIZED FOR BOTH SPEED AND FLEXIBILITY

CROSS-REFERENCE TO RELATED APPLICATIONS

"Macrocell with Product-term Cascade and Improved Register Utilization", invented by David Chiang et al, U.S. patent application Ser. No. 08/010,378, filed Jan. 28, 1993, is related to the present application and is incorporated herein by reference.

"Complementary Macrocell Feedback Circuit" invented by David J. Ridgeway, U.S. patent application Ser. No. 08/027,211, filed Mar. 5, 1993 is related to the present application and incorporated herein by reference.

FIELD OF THE INVENTION

This invention relates generally to programmable logic devices, and more particularly to a hybrid architecture including both high-speed blocks and high-flexibility blocks for the logical functions in Programmable Array Logic-based EPLDs.

BACKGROUND OF THE INVENTION

Basic PLDs (programmable logic devices) are based on a programmable logic array, normally composed of a specific number of input lines connected through a fixed or programmable array to the input terminals of a set of AND logic gates, the output terminals of which are in turn connected to the input terminals of a fixed or programmable array of OR gates. Devices are called PAL ®-based when the Programmable Array Logic has a fixed OR array. The size (number of gates) of the programmable array and the size (complexity) of the highly configurable associated I/O (input/output) macrocells has been increased recently over that of the basic PLD architecture to meet the requirements of complex logic functions and high configurability.

Recently, new kinds of PAL-based devices (chips) have appeared, such as the Altera Max family, AMD Mach family and XILINX EPLD devices that feature on each chip functional blocks which are structurally and functionally identical and have a programmable interconnect resource which interconnects the functional blocks. Such an interconnect is designated the programmable interconnect array (PIA) in the Altera Max family, the Switch Matrix in the AMD Mach family, and the Universal Interconnect matrix (UIM) in the XILINX XC7236 device. Each functional block on the chips mentioned includes a programmable AND array and several macrocells so that it is like a stand alone PAL, and upon appropriate configuration can be used logically separate from the rest of the chip or can communicate with the rest of the chip.

Figure 1:
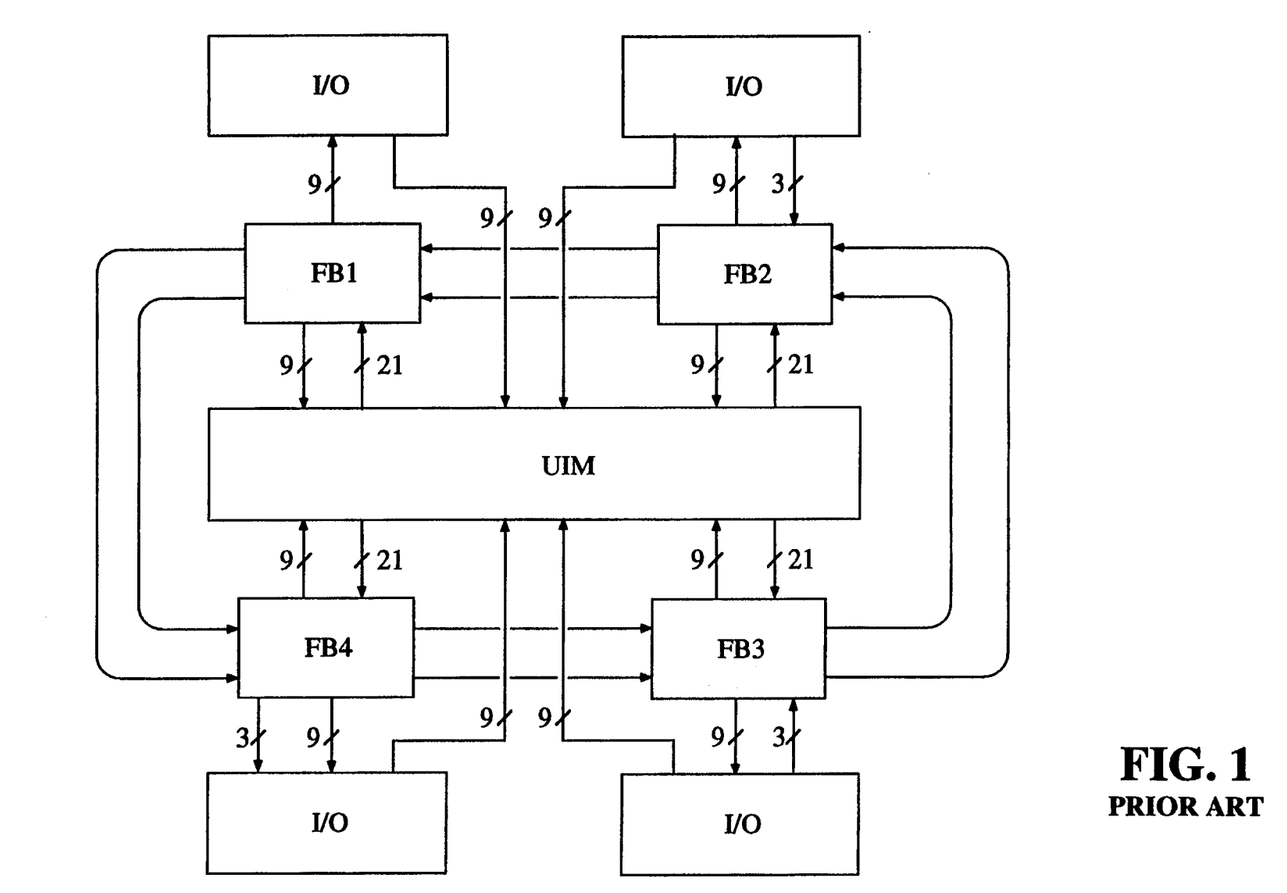
FIG. 1 is a simplified architecture of a PAL-based XC7236 chip, which has uniform functional blocks.

FIG. 1 illustrates in simplified form the architecture of the XILINX XC7236 chip, a PAL-based EPLD. Four configurable functional blocks FB1, FB2, FB3, FB4 are interconnected by a central universal interconnect matrix (UIM). Each of the four blocks FB1–FB4 receives 21 input lines from the UIM, and connects by nine output lines to chip I/O pads labelled "I/O" and/or back into the UIM. Blocks FB2, FB3, FB4 receive 3 input lines coming from the I/O pads as well. Each block FB-1–FB-4 has carry-in and carry-out lines as well as shift-in and shift-out lines, with the in lines of each block being connected to the out lines of a previous block and the out lines of each block being connected to the in lines of a next block, forming loops as illustrated around the blocks. Each of the functional blocks FB1–FB4 includes nine macrocells (not shown) and a programmable AND array (not shown) which is driven by 21 input lines from the UIM and three input lines coming directly from the I/O pads (for three blocks only in the case of the XC7236). The XC7236 device thus contains 36 macrocells each having identical structure.

Figure 2:
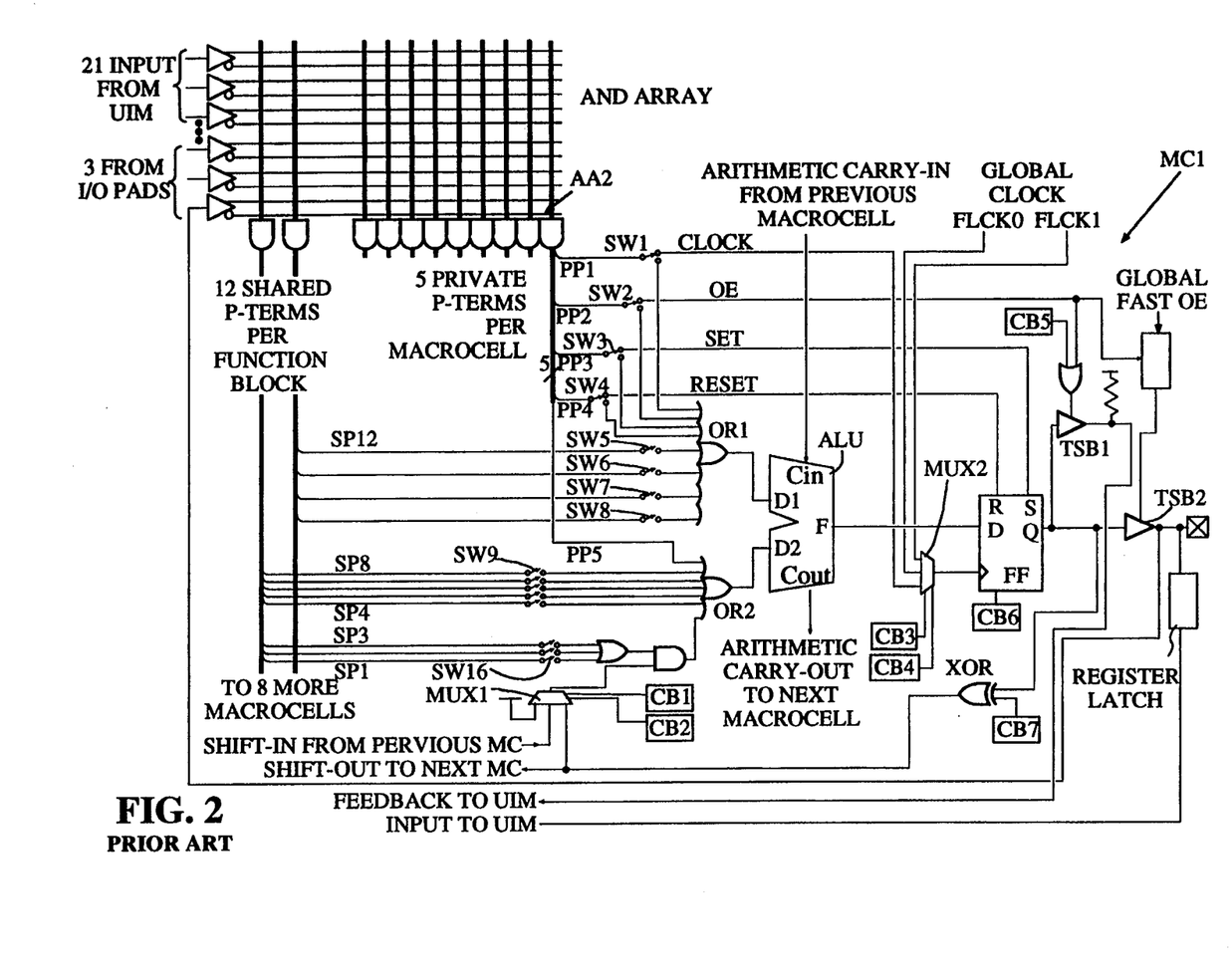
FIG. 2 is a schematic diagram of one of the macrocells and the programmable AND array in each block of the XC7236 chip.

FIG. 2 shows the schematic diagram of one of the macrocells and the AND array present in each functional block of the XC7236 chip. Macrocells MC1–MC9 in each block (FIG. 2 shows MC1 only) are driven by the product terms (P-terms) derived from the programmable AND array AA2 in the same block. Five P-terms PP1–PP5, PP6–PP10 . . . PP41–PP45 are private to each macrocell in the block, while an additional twelve P-terms SP1–SP12 are shared among the nine macrocells in each block. Four of the private P-terms PP1–PP4 can be selectively (through programming of programmable switch elements SW1–SW4) logically ORed by gate OR1 together with up to four shared P-terms SP9–SP12 and drive the D1 data input terminal of an arithmetic logic unit ALU. The other data input terminal D2 of the ALU is driven by the output signal of gate OR2 which logically ORs the fifth private P-term PP5 and up to eight of the remaining shared P-terms SP1–SP8. The four private P-terms PP1–PP4 can be programmed for other purposes; for instance the private P-term PP1 can be used as a dedicated clock signal for the flip-flop FF; P-term PP2 can be the output enable signal OE; P-term PP3 and P-term PP4 can be the asynchronous SET S and RESET R signals for the flip-flop FF.

The ALU can be programmed into two modes, logic mode and arithmetic mode. In the logic mode, the ALU is a 2-input function generator that can be programmed to generate any Boolean function of its two data input terminals D1 and D2. In the arithmetic mode, the ALU can be programmed to generate the arithmetic sum or difference of two operands, combined with a carry signal coming from the next lower order macrocell and feeds a carry output to the next higher order macrocell as well.

The ALU output F drives the D input terminal of the flip-flop FF. Flip-flop FF can be programmed by configuration bit CB6 to be transparent, making the output signal on terminal Q identical with the D terminal input signal, independent of the clock input signal, or to operate in the conventional flip-flop manner, triggered by the rising edge of the clock input signal. The clock signal source is programmable by programming of configuration bits CB3 and CB4 to select (via multiplexer MUX2) either the dedicated P-term PP1, or one of two global clock signals FLCK0 and FLCK1.

The output signal on terminal Q of flip flop FF can be optionally fed back and logically ORed into the input terminal D2 of the ALU after being logically ANDed with three shared P-terms SP1–SP3 by programming of the configuration bits CB1 and CB2. The polarity of the feedback signal can be controlled by the gate XOR by programming the configuration bit CB7.

A logic block with macrocells of this kind is both complex and highly configurable and can implement a variety of logic functions by programming of the configuration bits such as CB1–CB7, switches such as SW1–SW16, tri-state buffers such as TSB1 and TSB2, and multiplexers in the ALU. However, such high configurability requires a large number of logic gates in the speed path, which causes additional propagation delay. This, together with the delay caused by routing signals through the UIM limits the speed of such devices. High speed and high flexibility of logic functions are generally in conflict with each other and must be traded off in such prior art devices. So far, no devices exist that can offer both high speed and high flexibility of logic functions for user applications.

Some prior art FPGA devices include different kinds of blocks that are optimized for different applications. For example, the Actel ACT2 chip family has two types of logic blocks, a logic block for combinatorial functions and a logic block for both combinatorial and register functions. The two logic block types use common routing resources, and all blocks have their I/O routed via the common interconnect. These FPGAs do not have special sections of the chip with their own internal routing resources that optimize that particular section for speed or complexity.

SUMMARY OF THE INVENTION

Accordingly, one object of the present invention is to provide a PLD having both high speed and logic function flexibility.

Another object is to provide a hybrid architecture for a PAL-based chip which has sections optimized for speed and other sections optimized for logic function flexibility.

The invention is based on the discovery that for most user applications, even in high speed user systems, only a portion of the PLD requires high speed, and the rest of the PLD tends to be used for applications that do not operate at high speed, but are logically complex. One example is a very fast state machine which controls a slower bus interface structure. Here, the state machine reaction needs to be very quick but the bulk of the logic does not need to be as quick. Another example is where an address decoder must be much faster than other logic. In such cases, a hybrid architecture is the optimum solution for such user application. According to the present invention, instead of a uniform structure with identical macrocells as in prior art EPLDs, the hybrid architecture includes two different kinds of PAL-like blocks, a fast functional block being optimized for high speed and a flexible block being optimized for logic function flexibility.

In accordance with the present invention, the hybrid architecture includes on one chip functional logic blocks of a first type optimized for flexibility of logic function, and blocks of a second type optimized for high speed. Preferably, certain of the high speed blocks are directly connectable to chip input and/or output pads (terminals). Both types of cells include a programmable AND array, thus both types have some flexibility. Each fast block can selectively receive signals on a plurality of input lines directly from the chip I/O pads. This direction connection reduces the delay caused by the UIM. Also, output signals from the fast blocks can be directly fed back into that block without passing through the UIM. The fast blocks have dedicated output pads so as to increase speed.

In one embodiment of the present invention, the fast blocks have a programmable AND array smaller in size (having fewer gates) than the AND array in the flexible blocks. Since a smaller AND array generates fewer product terms to the macrocells in the fast block, the fast block in this embodiment provides a faster AND array speed.

The above and other objects, features and advantages of the present invention will be apparent from the following detailed description of the invention in conjunction with the drawings.

DETAILED DESCRIPTION OF THE INVENTION

Figure 3:
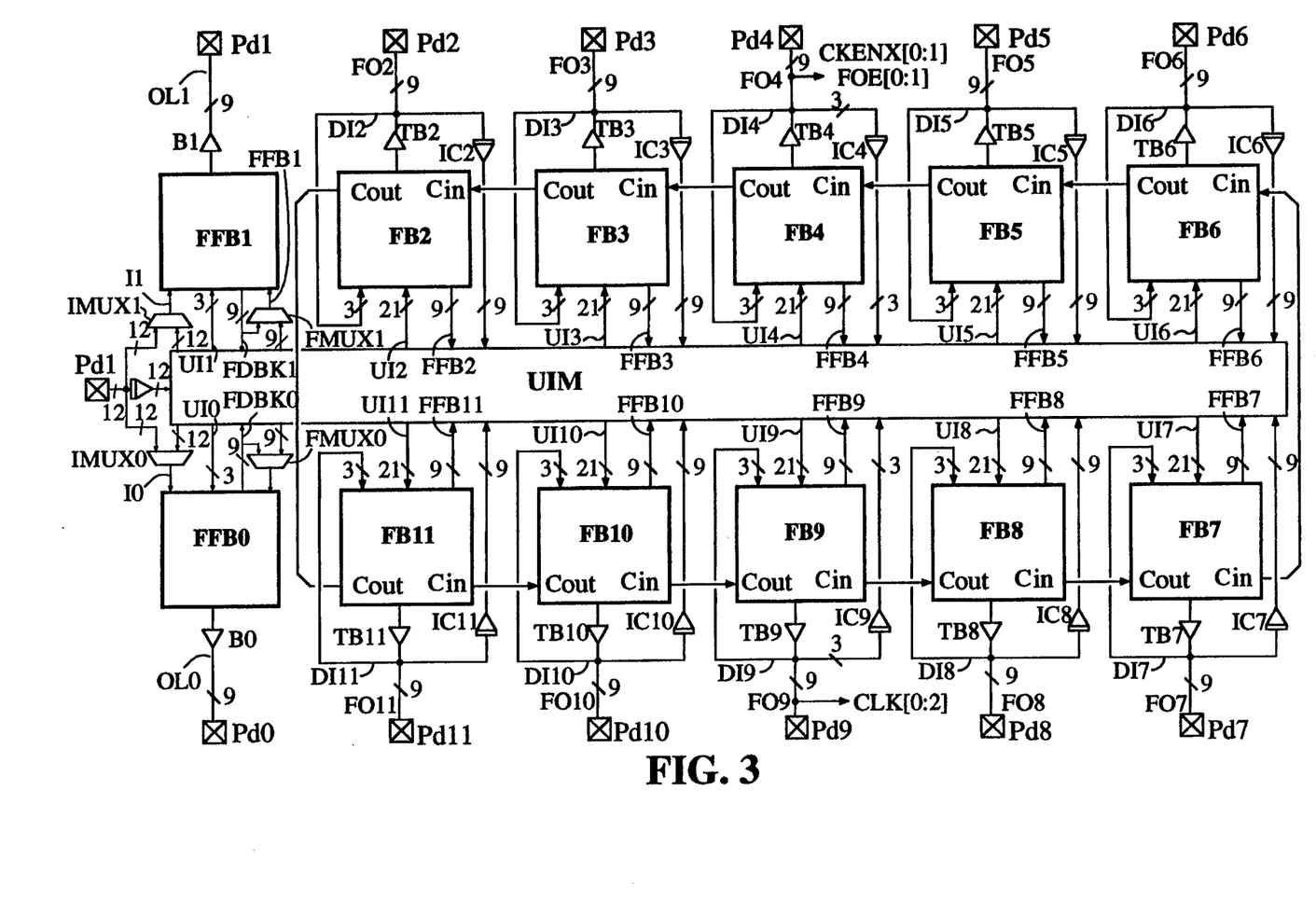
FIG. 3 illustrates a hybrid architecture optimized for both speed and high flexibility in accordance with the present invention.

FIG. 3 is a block diagram of an EPLD device in accordance with the present invention showing the hybrid architecture. (It is to be understood that FIG. 3, like FIG. 1, conventionally illustrates bus-type structures where one line on the figure or one circuit element represents respectively multiple conductors or multiple circuit elements.) The device includes ten identical conventional functional blocks FB2–FB11 and two fast functional blocks FFB0 and FFB1. Each conventional functional block FB2–FB11 is a stand alone PAL, including a programmable AND array and nine identical macrocells each similar to the ones shown in FIG. 2, being complex in structure and highly configurable. Function blocks FB2–FB11 each have a group of 21 input lines UI2 ... UI11 from the UIM connected to the input lines of the functional block AND array, a group of nine output lines FO3 ... FO11 connected from each block through a respective set of nine tri-state buffers TB2, TB3 ... TB11 to a corresponding group of nine I/O pads Pd2, ..., Pd11. Further, a carry-in line is connected from terminal Cin in one block to terminal Cout in an adjacent block to form a loop as shown in FIG. 3.

The nine output signals from each block are fed back into the UIM through respective groups of lines FFB2, FFB3 ..., FFB11. For each block, three input lines DI2, DI3, ..., DI11 connect directly from an I/O pad to an input line of the AND array. These input lines are used when the I/O pads are used as input pads. Nine input lines, one from each of nine I/O pads of each functional block (for flexible blocks FB2, FB3, FB5 through FB8, FB10 and FB11) and a smaller number (for example 3) of input lines (for flexible blocks FB4 and FB9) drive the UIM via input circuitry IC2, IC3 ... ., IC11, which can be programmed as an inverter, register or latch. This circuitry is described more fully in a copending patent application Ser. No. 08/027,211, by David J. Ridgeway entitled "Complementary Macrocell Feedback Circuit" filed Mar. 5, 1993 and incorporated herein by reference.

Figure 4:
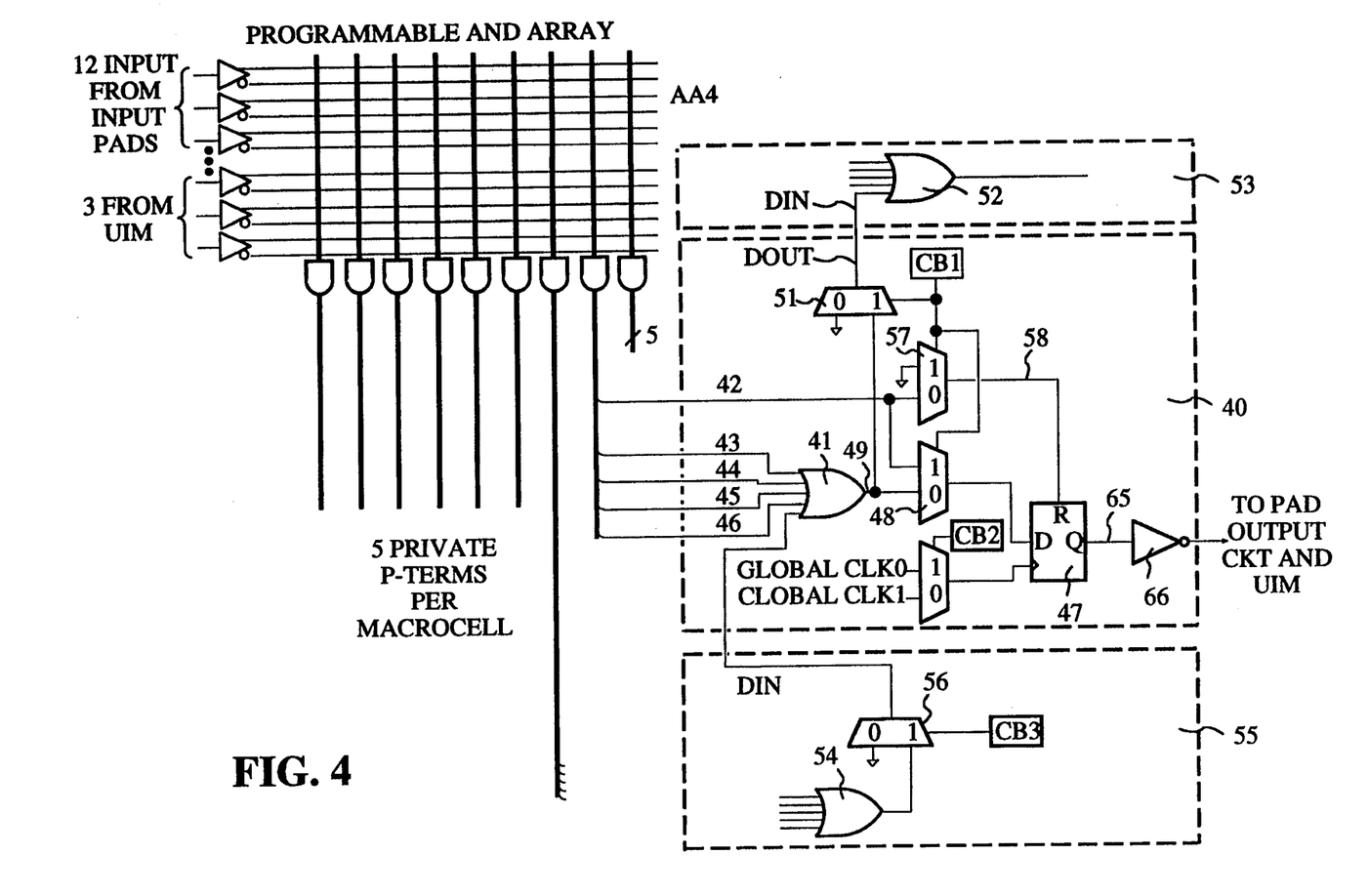
FIG. 4 shows a schematic diagram of one of the macrocells and the reduced programmable AND array in each fast functional block of FIG. 3.

As mentioned above, the functional blocks FB2–FB11 each include highly flexible logic functions. Functional blocks FFB0 and FFB1 are in contrast fast functional blocks and feature faster speed rather than high flexibility. Fast functional blocks FF0 and FF1 each include nine macrocells and a programmable AND array. FIG. 4 is a schematic diagram of the AND array, one complete macrocell, and parts of adjacent macrocells in one of the fast functional blocks FFB0, FFB1, showing the carry logic between adjacent macrocells.

As shown in FIG. 3, twelve input signals coming directly from the twelve dedicated input pads PdI can be selectively connected to the corresponding group of twelve input lines I0 and I1 of fast functional blocks FF0 and FF1 by programming the associated sets of multiplexers IMUX0 and IMUX1. The resulting data path does not pass through the UIM, providing a quicker input path. The other groups of three input lines UI0, UI1 associated respectively with blocks FFB0, FFB1 come from the UIM. The twelve input lines from the dedicated input pads PdI and the three input lines from the UIM to each fast functional block FFB0, FFB1 supply signals to the input lines of the programmable AND array AA4 of FIG. 4.

The fast functional blocks FFB0 and FFB1 each have nine dedicated output pads Pd0 and Pd1 to which they are connected through associated output buffers B0, B1 and nine output lines OL0, OL1 respectively. The nine output signals of each fast functional block FFB0, FFB1 can selectively be fed back via lines FDBK0, FDBK1 into the same block directly by means of multiplexers FMUX0 and FMUX1, providing a way of eliminating the delay otherwise caused by routing signals via the UIM. The nine output signals are also routed to the UIM, thus accessing the remainder of the device.

As shown in FIG. 4, the programmable AND array in each of the fast functional blocks FFB0, FFB1 has a shorter data path length that the flexible function block of FIG. 2. For example, a signal on line 43 of FIG. 4 may have come from an input pad through a buffer, through an AND gate, through OR gate 41, through MUX 48, flip flop 47 (two gates), inverter 66 to an output pad. This is a total of 7 gates. By contrast, in FIG. 2, an input signal from a pad will also pass through an input buffer and an AND gate. Then the signal will pass through a switch, an OR gate, an ALU (2 gates), a flip flop (2 gates) and an output buffer to a pad. This is a total of 9 gates. Thus the fast block saves two gates in the signal path. Compared to the high flexibility macrocell of FIG. 2, the macrocell for the fast functional blocks is simplified in structure in order to achieve high speed.

Macrocell 40 has five input lines 42–46 of P-terms from the AND array AA4. Four of the input lines 43–46 are the input lines to OR gate 41. The fifth input line 42 is a dedicated RESET signal line for flip-flop 47 when the output signal of OR gate 41 drives the D input terminal of flip-flop 47. Alternatively, input line 42 drives the D input terminal of flip-flop 47 when the output signal of OR gate 41 is cascaded to OR gate 52 in another (adjacent) macrocell 53 to expand the P-terms to be ORed by OR gate 52 in macrocell 53. The use of the signal on input line 42 depends therefore on the programming of configuration bit CB1. A more detailed description regarding this cascade of the P-terms in such macrocells is disclosed in the above cross-referenced U.S. patent application Ser. No. 08/010,378, entitled "Macrocell With Product-term Cascade and Improved Register Utilization". It is to be understood that FIG. 4 shows only one example of a fast function block, and FIG. 2 is only one example of a high complexity function block.

As seen from the above description, macrocell 40 and hence the fast functional blocks FFB0, FFB1 are optimized for high speed, while macrocell MC1 and the corresponding functional blocks FB2, FB3 . . . , FB11 are optimized for logic function flexibility. With such EPLDs, the portion of a user design that requires high speed is implemented in the fast functional blocks FFB0, FFB1, while parts of the design that are logically complex and do not need to operate at high speed are implemented by functional blocks FB2-FB11. This makes good use of the chip resources and provides both high speed and high flexibility for logical functions.

Figure 5:
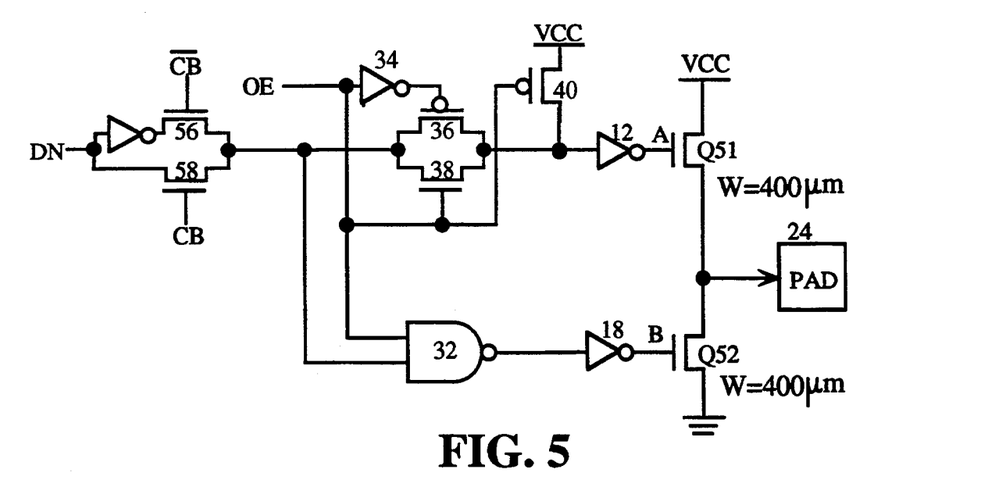
FIGS. 5 and 6 show schematic diagrams of output buffers optimized for flexibility and speed respectively.
Figure 6:
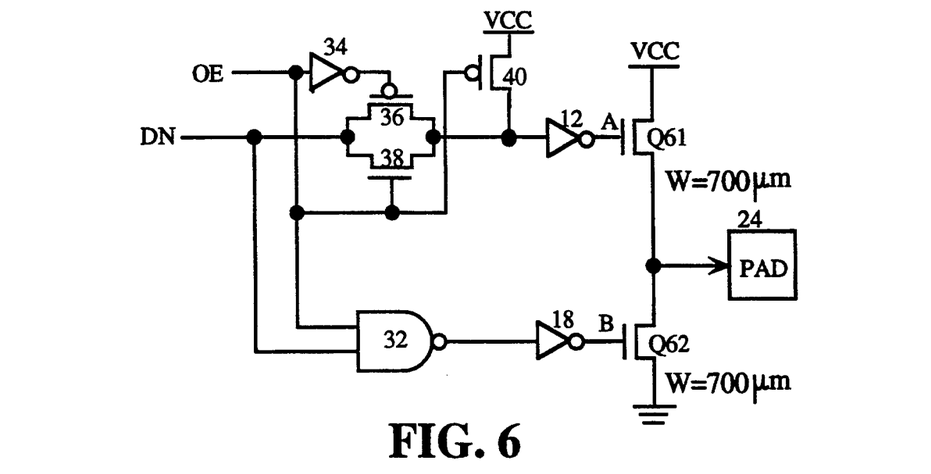

In addition to offering a choice of flexibility versus speed in the macrocell, the present invention also offers a choice of flexibility versus speed in the output buffers. An output buffer preferably used when flexibility is important is shown in FIG. 5. This buffer offers an optional inversion of input signal DN as selected by one of transistors 56 or 58 which is turned on by signal CB or its complement $\overline{CB}$. Output transistors Q51 and Q52 are sized to provide adequate drive and yet consume minimal power. For a higher speed output buffer, the circuit of FIG. 6 does not offer the optional inverter, thus shortening the signal path. In addition, higher speed is achieved by making the output transistors Q61 and Q62 wider. In one embodiment, the flexible output buffer of FIG. 5 uses transistor widths of 400 $\mu$m and the high speed output buffer of FIG. 6 uses output transistor widths of 700 $\mu$m. This output driver circuit is described more completely in commonly assigned co-pending U.S. patent application Ser. No. 07/973,093 invented by David Chiang and entitled "Output Buffer Circuit Having Reduced Switching Noise", incorporated herein by reference. The output buffer of FIG. 5 is preferably used in the circuit of FIG. 3 for the three-state buffers TB2 through TB11 and the output buffer of FIG. 6 is preferably used for buffers B0 and B1. However, in other embodiments higher output buffer speed can be combined with higher macrocell flexibility and higher macrocell flexibility can be combined with higher output buffer speed.

Although the present invention has been described and illustrated with particular embodiments, it is to be understood that this is by way of illustration and example only and is not to be taken by way of limitation. Different numbers of the two kinds of blocks, different circuitry of the two kinds of macrocells, and different input and output characteristics can be used, as apparent to those of ordinary skill in the art. The spirit and scope of the present invention is limited only by the terms of the appended claims.

I claim:

1. A programmable integrated circuit logic device comprising:
   a plurality of fast logic function blocks having input terminals at least some of which are connected to a pad of the device, and having at least one output terminal connected to a pad of the device, said fast logic function blocks being designed such that an output signal may be generated from input signals to that function block wherein the shortest sum-of-products path from input to output propagates through no more than 8 gates;
   a plurality of flexible logic function blocks each having input terminals and at least one output terminal and designed such that more functions of signals on a given number of input terminals may be selectively provided at said output terminal of that flexible logic function block than can be provided by said fast logic function blocks; and a universal interconnect matrix for interconnecting at least some of said input and output terminals of said fast logic function blocks and said flexible logic function blocks to each other.

2. A programmable integrated circuit logic device as in claim 1 in which said fast and flexible logic function blocks each include a programmable AND array.

3. A programmable integrated circuit logic device as in claim 2 in which said fast logic function blocks each include an AND array less complex than an AND array in each of said flexible logic function blocks.

4. A programmable integrated circuit logic device as in claim 1 in which at least some of said input terminals of said fast logic function blocks can be connected directly to external pads of said device without passing through said universal interconnect matrix.

5. A programmable integrated circuit logic device as in claim 1 in which at least some of said output terminals of said fast logic function blocks can be connected directly to external pads of said device without passing through said universal interconnect matrix.

6. A programmable integrated circuit logic device as in claim 1 in which at least some of said output terminals of one of said fast logic function blocks can be connected directly to at least some of said input terminals of said one of said fast logic function blocks without passing through said universal interconnect matrix.

7. A programmable integrated circuit logic device as in claim 2 in which said fast logic function blocks each further include a plurality of OR arrays each for generating a sum term from outputs of said AND array; and means for selectively providing an output of one of said OR arrays as input to another of said OR arrays, thereby expanding the number of inputs for which a sum can be generated.

8. A programmable integrated circuit logic device as in claim 1, wherein each flexible functional block comprises multiple first type macrocells of high logical function flexibility and a first type programmable AND array, and the fast functional block comprises multiple second type macrocells of high speed and a second type programmable AND array different from the first type AND array.

9. A programmable logic device including a plurality of blocks and programmable interconnects for interconnecting the blocks, comprising:

first type functional blocks each having a first type programmable AND array and a plurality of first type macrocells each having a first number of logic gates; and second type functional blocks each having a second type programmable AND array and a plurality of second type macrocells each having a second number of logic gates less than the first number, wherein each of the second type functional blocks is programmably connected to a signal terminal of the device.

10. A device as in claim 9, wherein the second type functional block programmably receives input signals directly from dedicated device input terminals.

11. A device as in claim 9, wherein an output signal from the second type functional block is selectively fed back into said second type functional block.

12. A device as in claim 9, wherein the second type programmable AND array has a smaller number of logic gates than does the first type programmable AND array.

13. A programmable integrated circuit logic device comprising:

a plurality of logic function blocks each having at least one input terminal and at least one output terminal;

a plurality of external pads;

a plurality of output buffers of a first type each having a particular number of logic gates n its signal propagation path;

a plurality of output buffers of a second type each having less than the particular number of logic gates in its signal propagation path; and an interconnect for connecting the output terminals of selected logic function blocks to said external pads by an output buffer, each said output buffer being one of the first and second type.

14. A programmable integrated circuit logic device as in claim 13 wherein said output buffers of the first and second type each include an output inverter having two transistors, and wherein the two transistors in said second type of output buffer are each larger than the two transistors in said first type of output buffer.

* * * * *

UNITED STATES PATENT AND TRADEMARK OFFICE
CERTIFICATE OF CORRECTION

PATENT NO. : 5,362,999
DATED : November 8, 1994
INVENTOR(S) : David Chiang

It is certified that error appears in the above-indentified patent and that said Letters Patent is hereby corrected as shown below:

Col. 3, line 67, "(having fewer gates)" should read --(having fewer gates)--.

Claim 13, col. 8, line 34, "n" should read --in--.

Signed and Sealed this

Nineteenth Day of September, 1995

Attest:

BRUCE LEHMAN

*Attesting Officer*  *Commissioner of Patents and Trademarks*